(12) United States Patent
Mosig et al.

(10) Patent No.: US 6,340,616 B1
(45) Date of Patent: Jan. 22, 2002

(54) METHOD FOR FABRICATING AN INTEGRATED ELECTRONIC CIRCUIT AND INTEGRATED ELECTRONIC CIRCUIT

(75) Inventors: Karsten Mosig, Villach (AT); Matthias Stecher, Munich; Werner Schwetlick, Groebenzell, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/513,616

(22) Filed: Feb. 25, 2000

(30) Foreign Application Priority Data

Feb. 25, 1999 (DE) .......................................... 199 08 188

(51) Int. Cl.⁷ ............................................ H01L 21/336
(52) U.S. Cl. ..................................................... 438/268
(58) Field of Search ........................ 438/268, 269–274, 438/570–583, 612, 620

(56) References Cited

PUBLICATIONS

Derwent Abstracted Publication No. DE 19908188A of foreign priority document of the instant application.*

* cited by examiner

*Primary Examiner*—Charles Bowers
*Assistant Examiner*—Craig Thompson
(74) *Attorney, Agent, or Firm*—Herbert L. Lerner; Laurence A. Greenberg; Werner H. Stemer

(57) ABSTRACT

A method for fabricating an integrated electronic circuit includes producing electrically active elements in the region of one plane. At least one insulation layer and at least one contact-making layer are applied on the electrically active elements, and subsequently at least one connecting wire is applied to the contact-making layer. The contact-making layer is produced in such a way that the contact-making layer has a thickness which is at least 10% of the radius of the connecting wire. An integrated electronic circuit is fabricated with the aid of the method.

8 Claims, 4 Drawing Sheets

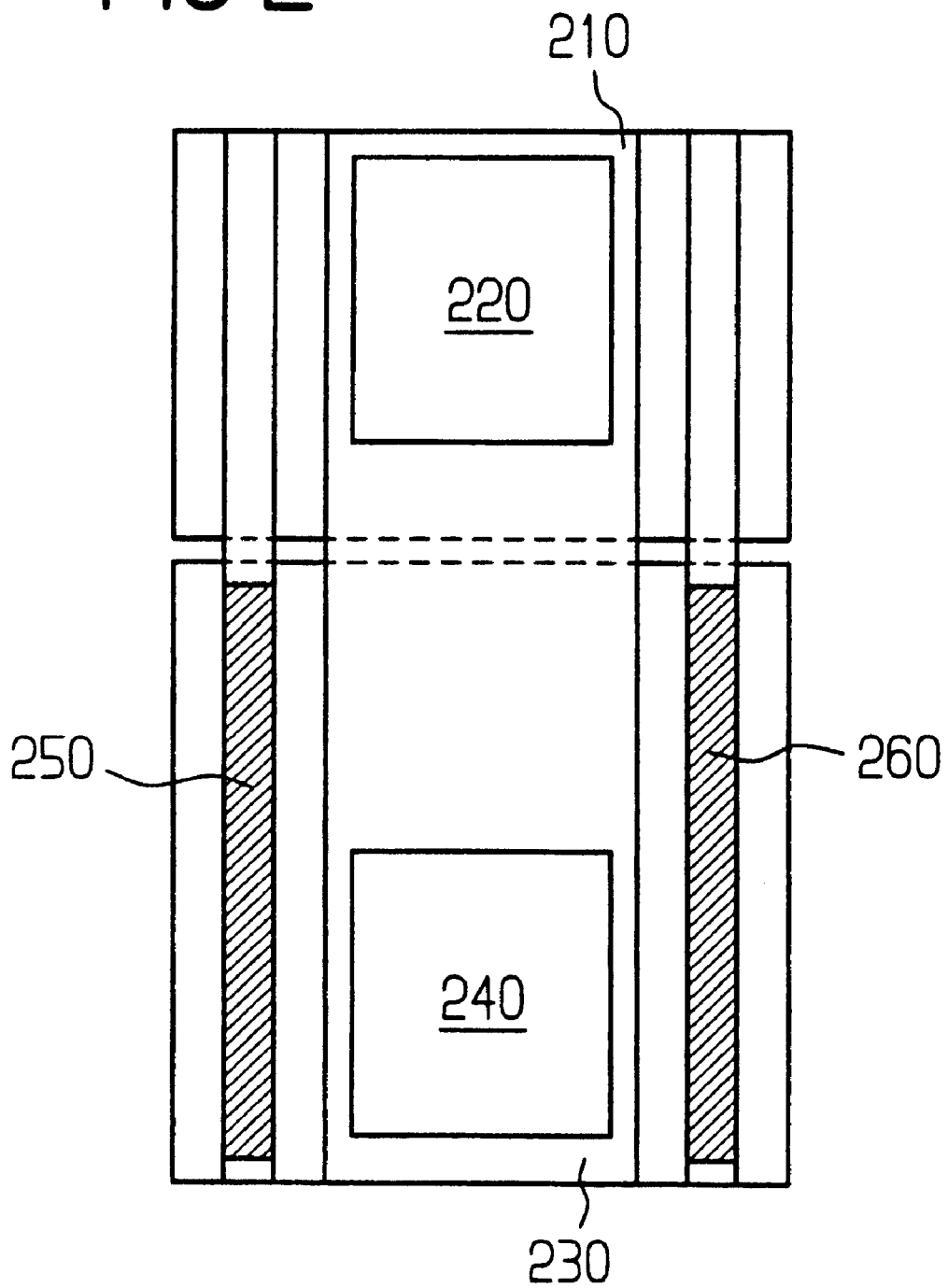

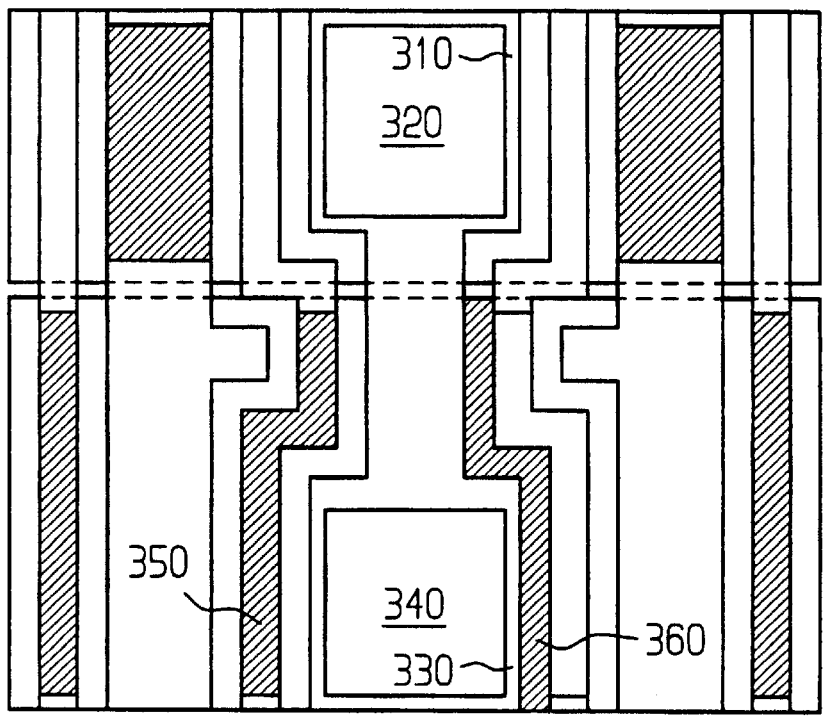
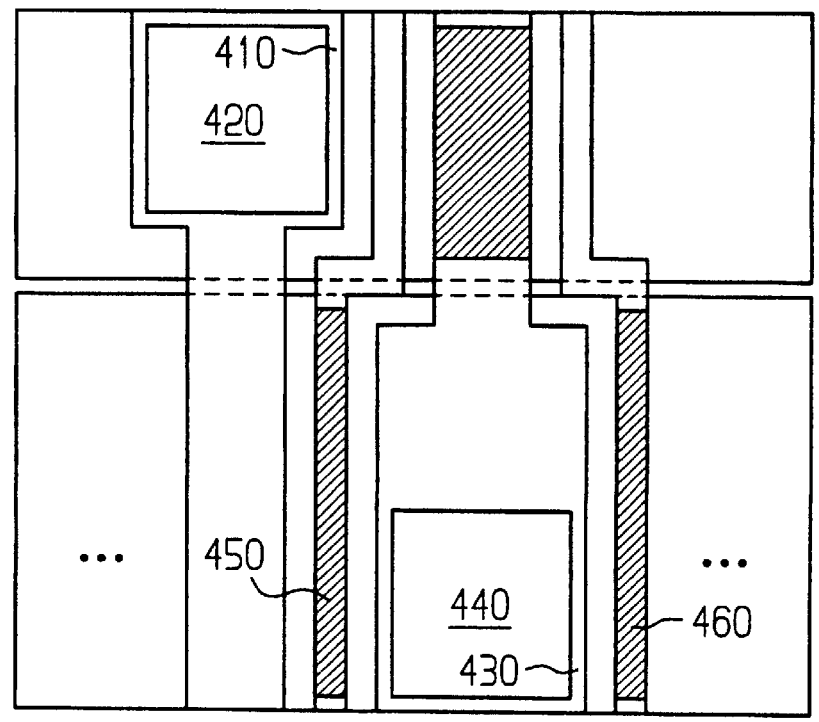

METHOD FOR FABRICATING AN INTEGRATED ELECTRONIC CIRCUIT AND INTEGRATED ELECTRONIC CIRCUIT

BACKGROUND OF THE INVENTION

FIELD OF THE INVENTION

The invention relates to a method for fabricating an integrated electronic circuit, in which electrically active elements are produced in the region of one plane, at least one insulation layer and at least one contact-making layer are applied on the electrically active elements, and subsequently at least one connecting wire is applied to the contact-making layer.

The invention furthermore relates to an integrated electronic circuit, having a plane in which electrically active elements are situated, at least one insulation layer and at least one contact-making layer being applied on the electrically active elements, and at least one connecting wire being applied on the contact-making layer.

It is known to carry out the method of the generic type in such a way that intermediate layers are deposited in order to protect the active elements against any adverse effects during subsequent application of a connecting wire.

U.S. Pat. No. 4,984,061 discloses a placement of the connecting wire above a wiring plane and producing the intermediate layer between the wiring plane and the connecting wire. That method includes patterning the intermediate layer.

Patterning the intermediate layer is also disclosed in U.S. Pat. No. 5,854,507.

U.S. Pat. No. 5,751,965 likewise discloses a method in which a connecting wire is disposed above a wiring plane. In that case, at least three intermediate layers are produced between the wiring plane and the connecting wire.

European Patent Application EP 0 587 442 A2 and an article entitled: Wire Bonds Over Active Circuits, IEEE, 1994, pp. 922–928, by G. Heinen at al., disclose producing an intermediate layer made of polyimide below the contact-making layer.

European Patent Application EP 0 100 100 A2 discloses constructing the intermediate layer from polycrystalline silicon.

U.S. Pat. No. 5,847,448 discloses constructing an integrated electronic circuit of the generic type in a three-dimensional manner.

SUMMARY OF THE INVENTION

It is accordingly an object of the invention to provide a method for fabricating an integrated electronic circuit and an integrated electronic circuit, which overcome the hereinafore-mentioned disadvantages of the heretofore-known devices and methods of this general type in such a way that the method can be carried out with the lowest possible outlay, and damage to active elements is avoided when connecting wires are connected to a contact-making layer.

With the foregoing and other objects in view there is provided, in accordance with the invention, a method for fabricating an integrated electronic circuit, which comprises producing electrically active elements in a region of one plane; applying at least one insulation layer and at least one contact-making layer on the electrically active elements; subsequently applying at least one connecting wire with a given radius to the contact-making layer; and producing the contact-making layer with a thickness of at least 10% of the given radius.

The invention provides for the thickness of the contact-making layer and the dimension of the connecting wire to be coordinated with one another.

In accordance with another mode of the invention, the contact-making layer has a thickness which is at least 15% of the radius of the connecting wire.

In accordance with a further mode of the invention, in order to completely avoid any adverse effects on the active elements as a result of the process of connecting the connecting wire to the contact-making layer, the active elements are disposed in such a way that the contact-making layer is formed as a planar area.

This particularly advantageous embodiment of the invention provides for the connecting wire to be disposed on a sufficiently large planar area above the active elements. This particularly preferred embodiment of the invention includes a combination of technological measures and a targeted configuration of the layout. The structure of the contact-making layer in the form of a planar area is preferably obtained by the individual active elements being formed by sufficiently large transistors, in particular quasi vertical DMOSFET transistors.

In accordance with an added mode of the invention, a further increase in the reliability of the integrated electronic circuit is obtained by producing an intermediate layer in the form of a planar area.

In accordance with an additional mode of the invention, the intermediate layer is interrupted only by contact holes.

In accordance with yet another mode of the invention, an increase in the reliability of the integrated electronic circuit is also obtained by producing at least two further metalization layers in addition to the contact-making layer.

In accordance with yet a further mode of the invention, the contact-making layer is strengthened in the region of the connecting wire. In accordance with yet an added mode of the invention, this is done in a particularly simple and expedient manner by a metal being vapor-deposited in the region of the connecting wire. The vapor-deposited metal preferably has the same composition as the remaining metal of the contact-making layer.

With the objects of the invention in view there is also provided an integrated electronic circuit, comprising electrically active elements disposed in a plane; at least one insulation layer and at least one contact-making layer applied on the electrically active elements; at least one connecting wire with a given radius, the at least one connecting wire applied on the contact-making layer; and the contact-making layer having a thickness of at least 10% of the given radius.

Other features which are considered as characteristics for the invention are set forth in the appended claims.

Although the invention is illustrated and described herein as embodied in a method for fabricating an integrated electronic circuit and an integrated electronic circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a plan view of a first embodiment of a cell array according to the invention;

FIG. 3 is a plan view of another embodiment of a cell array according to the invention;

FIG. 4 is a plan view of a further embodiment of a cell array according to the invention.

DESCRIPTION OF THE PREFERRED EMBODIMENTS

Figure 1:
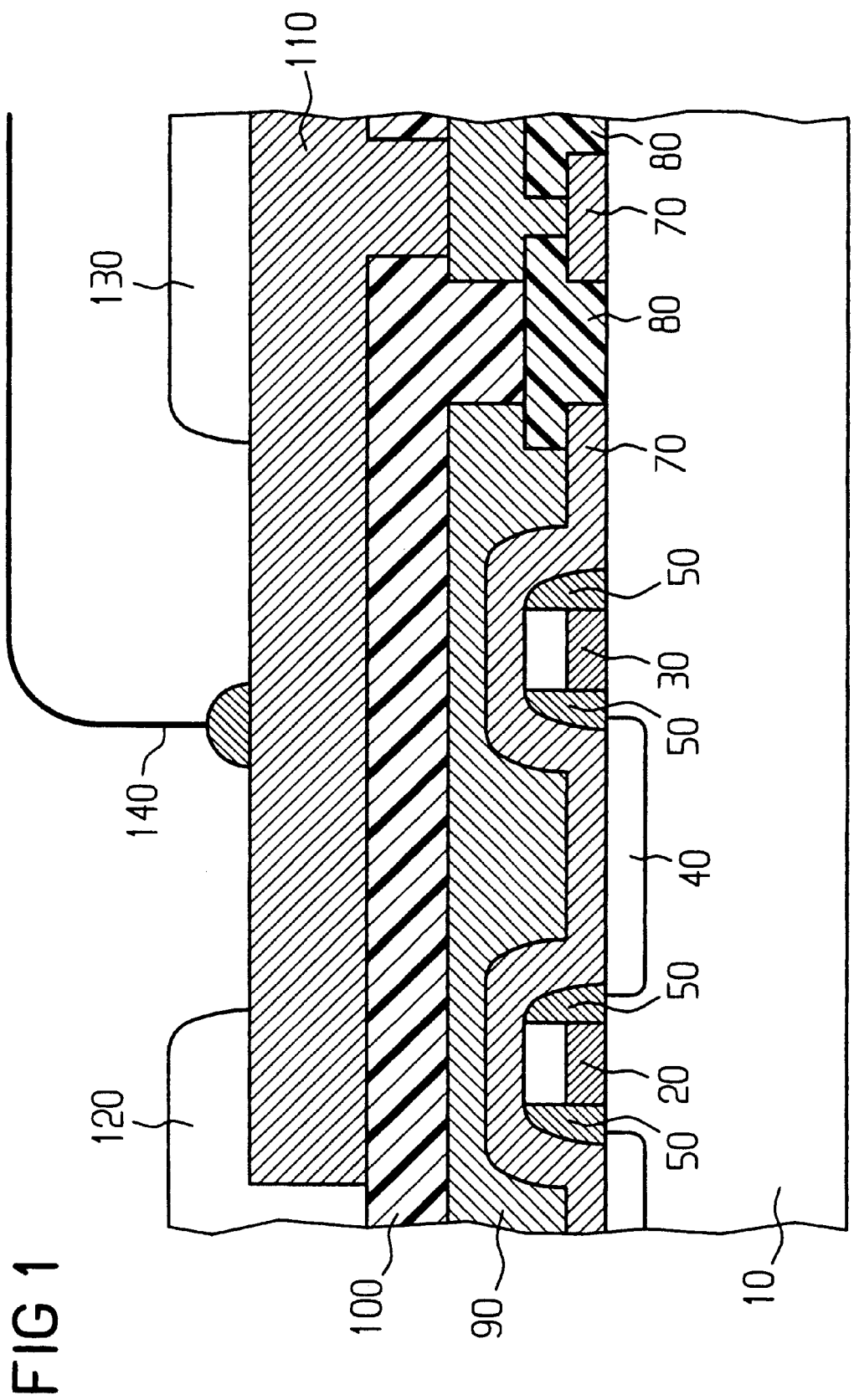
FIG. 1 is a fragmentary, diagrammatic, cross-sectional view of an integrated electronic circuit according to the invention.

Referring now to the figures of the drawings in detail and first, particularly, to FIG. 1 thereof, there is seen an integrated electronic circuit, including a cell array 10 on which electrically active elements 20, 30 are situated. The electrically active elements 20, 30 are MOS transistors, for example.

The cell array 10 is preferably fabricated as follows: a p-doped well with a dopant concentration of $1 \times 10^{17}$ cm$^{-3}$, for example, is formed by implantation in a semiconductor substrate that is made, for example, of a p-doped monocrystalline silicon with a basic concentration of a dopant such as boron of preferably $1 \times 10^{15}$ cm$^{-3}$ to $1 \times 10^{16}$ cm$^{-3}$, for example $2 \times 10^{15}$ cm$^{-3}$. The depth of the p-doped well is approximately 1 $\mu$m, for example.

A channel region 40 is situated between the MOS transistors. The MOS transistors have spacers 50 made of an insulating material such as borophosphorus silicate glass (BPSG). A covering layer situated on each of the MOS transistors is made, for example, of a silicon oxide $SiO_2$ formed according to a TEOS ($Si(OC_2H_5)_4$) method. The TEOS method is familiar to a person skilled in the art and is preferably carried out in such a way that tetraethyl orthosilicate is converted into silicon oxide at a temperature of approximately 700° C. and a pressure in the region of approximately 40 Pa.

A first metal layer 70 is situated on the electrically active elements 20, 30 and the channel regions 40 situated between them. The metal layer 70 is composed of aluminum, for example, and has preferably been fabricated with the aid of a sputtering method. The deposition of the first metal layer 70 has been carried out in such a way that holes remained free in which an insulation material 80 could be introduced.

A second metal layer 90, which has been fabricated in the most planar manner possible, is situated on the first metal layer 70 and the insulation material 80. The second metal layer 90 is fabricated in the most planar manner possible, preferably by the metal being made to flow directly after its sputtering. This is done, for example in the case where the metal is aluminum, by the aluminum being heated to 550° C. or being exposed to a high pressure. As a result, the metal flows, fills cavities and forms a plane surface.

An insulating layer 100, which is likewise as plane as possible, is situated on the second metal layer 90. A contact-making layer 110 is preferably composed of aluminum. The contact-making layer has a thickness of from 2 $\mu$m to 10 $\mu$m, preferably approximately 5 $\mu$m. Passivation zones 120, 130 are situated on the contact-making layer 110. A connecting wire 140 is applied between the passivation zones 120 and 130. The connecting wire 140 is preferably applied by a wire bonding method. This involves a joining method in which wires, for example made of a gold or aluminum alloy with a diameter starting preferably from 10 $\mu$m, are connected to the contact-making layer. In the wire bonding method, the wires are preferably not melted. Instead, an oxide layer situated on their surface is ground up by pressure, heat or ultrasound, after which the wires and the contact-making layer are brought into such close contact that they are permanently connected by van der Waals forces. Suitable variants are, by way of example, thermocompression (hot press welding), where the connecting wires are heated in such a way that the oxide layer chips off. The connecting wire is pressed onto the contact-making layer at temperatures of approximately 250 to 300° C., preferably approximately 280° C. In the case of ultrasonic welding, ultrasonic vibrations directed tangentially to the surface and perpendicularly to the force tear the oxide layer and connect the connecting wire to the contact-making layer. Thermosonic bonding (hot ultrasonic welding) is likewise suitable as a further method.

FIG. 2 illustrates a cell array made of quasi vertical DMOSFET transistors, in which a source 210 of a MOS transistor is provided with a source terminal 220 in the form of a pad. Likewise, a drain 230 is connected to a drain terminal 240 in the form of a pad. Contact holes (vias) 250, 260 extend parallel to a main direction of the source 210 and of the drain 230.

FIG. 3 illustrates a cell array in which a source 310 is likewise provided with a source terminal 320. Likewise, a drain 330 is provided with a drain terminal 340. In this variant of the cell array, the layout is chosen in such a way that the source has a smaller width outside the source terminal 320 than in the region of the source terminal 320. Likewise, the drain 330 has a smaller width in regions outside the drain terminal 340 than in the region of the drain terminal 340. Contact holes 350 and 360 likewise extend parallel to the drain, as in the case of the embodiment shown in FIG. 2. However, in the case of the embodiment shown in FIG. 3, the course of the contact holes 350, 360 follows the constriction of the drain outside the region of the drain terminal 340.

FIG. 4 illustrates a cell array made of quasi vertical DMOSFET transistors, in which a source 410 of a MOS transistor is provided with a source terminal 420 in the form of a pad. Likewise, a drain 430 is connected to a drain terminal 440 in the form of a pad. Contact holes (vias) 450, 460 extend parallel to a main direction of the drain 430. The source 410 and the drain 430 are disposed offset with respect to one another.

Figure 5:
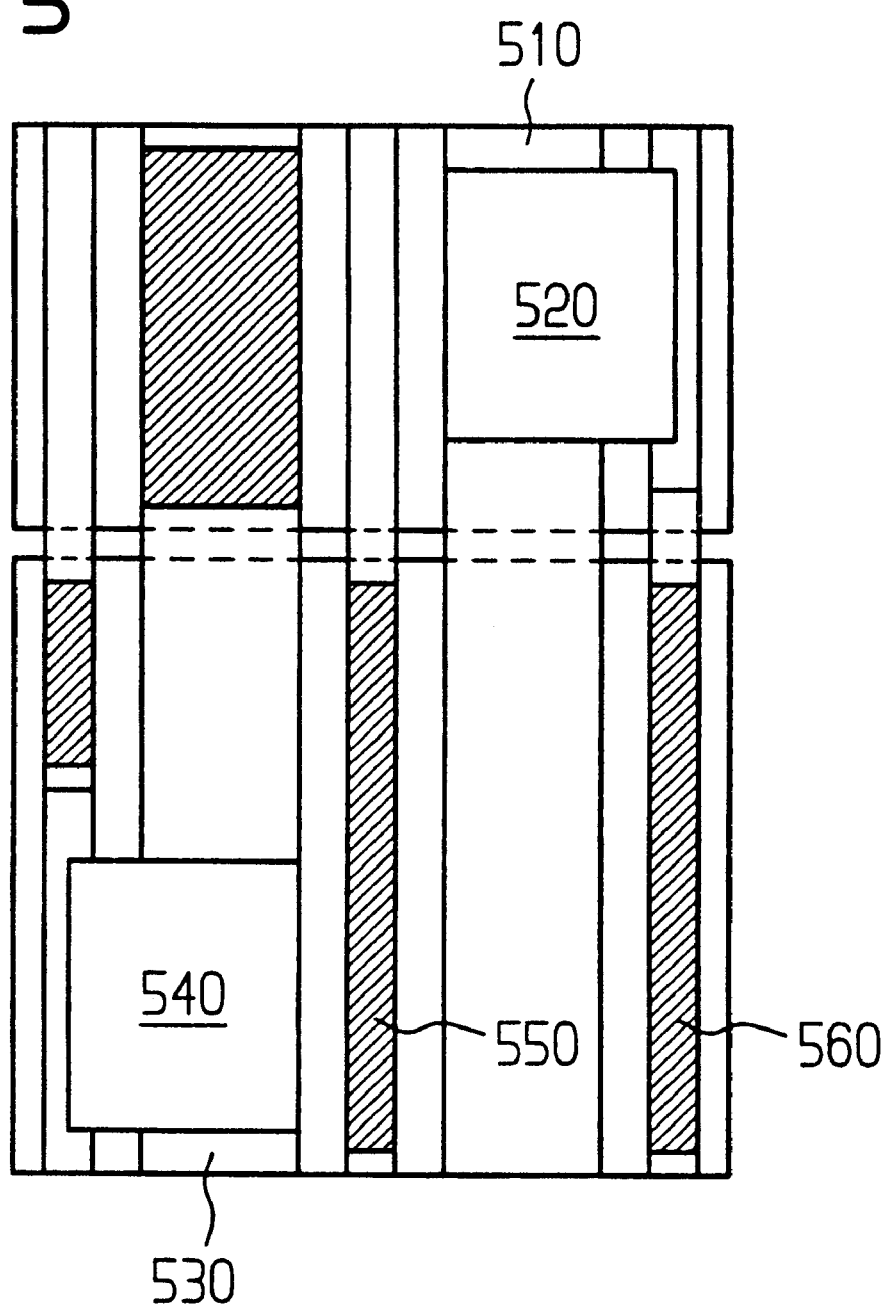
FIG. 5 is a plan view of a further cell array according to the invention.

FIG. 5 likewise illustrates a cell array made of quasi vertical DMOSFET transistors, in which a source 510 of a MOS transistor is provided with a source terminal 520 in the form of a pad. Likewise, a drain 530 is connected to a drain terminal 540 in the form of a pad. Contact holes (vias) 550, 560 extend parallel to a main direction of the drain 530. The source 510 and the drain 530 are disposed offset with respect to one another.

We claim:

1. A method for fabricating an integrated electronic circuit, which comprises:

producing electrically active elements in a region of one plane;

applying at least one insulation layer and at least one contact-making layer on the electrically active elements;

subsequently applying at least one connecting wire with a given radius to the contact-making layer; and producing the contact-making layer with a thickness of at least 10% of the given radius.

2. The method according to claim 1, which comprises carrying out the step of producing the contact-making layer with a thickness of at least 15% of the given radius of the connecting wire.

3. The method according to claim 1, which comprises configuring the active elements to form the contact-making layer as a planar area.

4. The method according to claim 1, which comprises producing an intermediate layer in the form of a planar area.

5. The method according to claim 4, which comprises interrupting the intermediate layer only by contact holes.

6. The method according to claim 1, which comprises producing at least two further metalization layers in addition to the contact-making layer.

7. The method according to claim 1, which comprises strengthening the contact-making layer in the region of the connecting wire.

8. The method according to claim 7, which comprises vapor-depositing a metal in the region of the connecting wire.

* * * * *